(12) United States Patent
Kuo et al.

(10) Patent No.: US 7,583,124 B2
(45) Date of Patent: Sep. 1, 2009

(54) DELAYING STAGE SELECTING CIRCUIT AND METHOD THEREOF

(75) Inventors: Tung-Chen Kuo, Hsin-Chu (TW); Ming-Chun Chang, Chia-I (TW)

(73) Assignee: Realtek Semiconductor Corp., HsinChu (TW)

( * ) Notice: Subject to any disclaimer, the term of this patent is extended or adjusted under 35 U.S.C. 154(b) by 34 days.

(21) Appl. No.: 12/019,645

(22) Filed: Jan. 25, 2008

(65) Prior Publication Data

US 2009/0039938 A1     Feb. 12, 2009

(30) Foreign Application Priority Data

Jan. 25, 2007 (TW) .............................. 96102764 A

(51) Int. Cl.
*H03H 11/26* (2006.01)
(52) U.S. Cl. ................... 327/276; 327/265; 327/161
(58) Field of Classification Search ................ 327/151, 327/160, 291–294, 298, 407–413, 161, 261, 327/265, 276, 279, 286, 262
See application file for complete search history.

(56) References Cited

U.S. PATENT DOCUMENTS 5,369,640 A * 11/1994 Watson et al. ............... 714/700

| | | | | |
|---|---|---|---|---|
| 6,650,661 B1 * | 11/2003 | Buchanan et al. | ........... | 370/516 |
| 7,187,220 B1 * | 3/2007 | Alben et al. | ................. | 327/156 |
| 7,231,008 B2 * | 6/2007 | Choudhury et al. | ......... | 375/354 |
| 7,456,674 B2 * | 11/2008 | Oakland | ..................... | 327/291 |
| 2004/0221078 A1 * | 11/2004 | Samuel et al. | .............. | 710/107 |

\* cited by examiner

*Primary Examiner*—Long Nguyen
*Assistant Examiner*—Sibin Chen
(74) *Attorney, Agent, or Firm*—Winston Hsu

(57) ABSTRACT

A delaying stage selecting circuit for selecting a specific delaying stage from a plurality of delaying stages, where the delaying stages are for outputting delayed clock signals, includes: a first register for sampling the delayed clock signals according to a clock signal to generate sampled values; first memory units, wherein the first memory units are utilized to memorize the sampled values, and each of first memory unit outputs at least one of the sampled values according to a corresponding first selecting signal; a first selecting unit, for outputting the sampled values according to a second selecting signal; a determining module, for determining if the sampled values meet a specific relation, where if the determination result is positive then determining the particular delaying stage; and a counter for generating a counting value to control the delayed clock signal sampled by the first register.

17 Claims, 4 Drawing Sheets

DELAYING STAGE SELECTING CIRCUIT AND METHOD THEREOF

BACKGROUND OF THE INVENTION

1. Field of the Invention

The present invention relates to a delaying stage selecting circuit and a method thereof, and particularly relates to a delaying stage selecting circuit, which compares each delay signal and a system clock, records the comparing result, and determines a preferred delaying stage according to the comparing result, and a method thereof.

2. Description of the Prior Art

Delay circuits are always utilized in a circuit to synchronize a plurality of clock signals. Conventionally, delay circuits can be classified into analog delay circuits and digital delay circuits.

FIG. 1 is a block diagram illustrating a prior art delay circuit, which can generate a plurality of delayed clock signals of the same frequency but different phase according to an input clock signal $CK_{IN}$. As shown in FIG. 1, the delay circuit 100 includes: a phase detector 102, a charge pump 104, a loop filter 106, and a delay line 108. A control voltage Vctrl from the loop filter 106 can adjust the delay effect caused by each delaying stage for the input clock signal $CK_{IN}$. The delayed clock signal from the m-th delaying stage is $CK_m$ (m is an integer between 1 and N) wherein the difference between the delayed clock signal $CK_N$ from the last delaying stage and the input clock signal $CK_{IN}$ is $T_d$. The phase detector 102 utilizes the input clock signal $CK_{IN}$ and the delayed clock signal $CK_N$ as input signals, and compares the phase difference between both to generate a rising control signal UP and a falling control signal DOWN. The phase detector 102 also utilizes the rising control signal UP and the falling control signal DOWN to control the charge pump 104 in order to control the control signal $V_{ctrl}$ via the loop filter 106, thereby the delay time Td between the input clock signal $CK_{IN}$ and the delayed clock signal $CK_N$ can be decreased or increased.

A digital delay circuit can be of various kinds. Normally, a digital circuit includes a delay line having a plurality of delaying stages (flip flops for example), and utilizes a multiplexer or an inverter etc. to control the delaying stages.

The above-mentioned delay circuit generates delay signals with different delay amounts, and a desired delay signal is selected from a plurality of delay signals. Ideally, a desired delay signal needs no adjustment to meet requirements of the system once it is determined and selected. In reality, a delay amount of the delay signal always changes corresponding to many factors such as PVT (Process, Voltage, Temperature), so a system operation error will often occur.

SUMMARY OF THE INVENTION

One embodiment of the present invention provides a delaying stage selecting circuit, which compares each delay signal with a system clock, records the comparing result, and determines a delaying stage according to the comparing result. A related method is also disclosed.

One embodiment of the present invention discloses a delaying stage selecting circuit, for selecting a specific delaying stage from a plurality of delaying stages. The delaying stages are used for outputting a plurality of delayed clock signals. The delaying stage selecting circuit comprises: a first register, coupled to the delaying stages, for sampling the delayed clock signals according to a clock signal to generate a plurality of sampled values; a plurality of first memory units, coupled to the first register, wherein the first memory units are utilized to memorize the sampled values, and each first memory unit outputs at least one of the sampled values according to a corresponding first selecting signal; a first selecting unit, coupled to the first memory units, for outputting the sampled values according to a second selecting signal; a determining module, coupled to the first selecting unit, for determining if the sampled values meet a specific relation and for determining the particular delaying stage if the determination result is positive; and a counter, coupled to the determining module, for generating a counting value to control the delayed clock signal sampled by the first register.

The embodiment of the present invention also discloses a delaying stage selecting method corresponding to the above-mentioned circuit. The method includes: sampling the delayed clock signals according to a clock signal to generate a plurality of sampled values; memorizing the sampled values and outputting the sampled values according to a corresponding first selecting signal; outputting the sampled values according to a second selecting signal; determining if the sampled values meet a specific relation and determining the particular delaying stage if the determination result is positive; and generating a counting value to control the delayed clock signals sampled by the first register.

According to the above-mentioned embodiments, a suitable delay signal can be selected in real-time, such that the system can avoid being affected by external factors.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
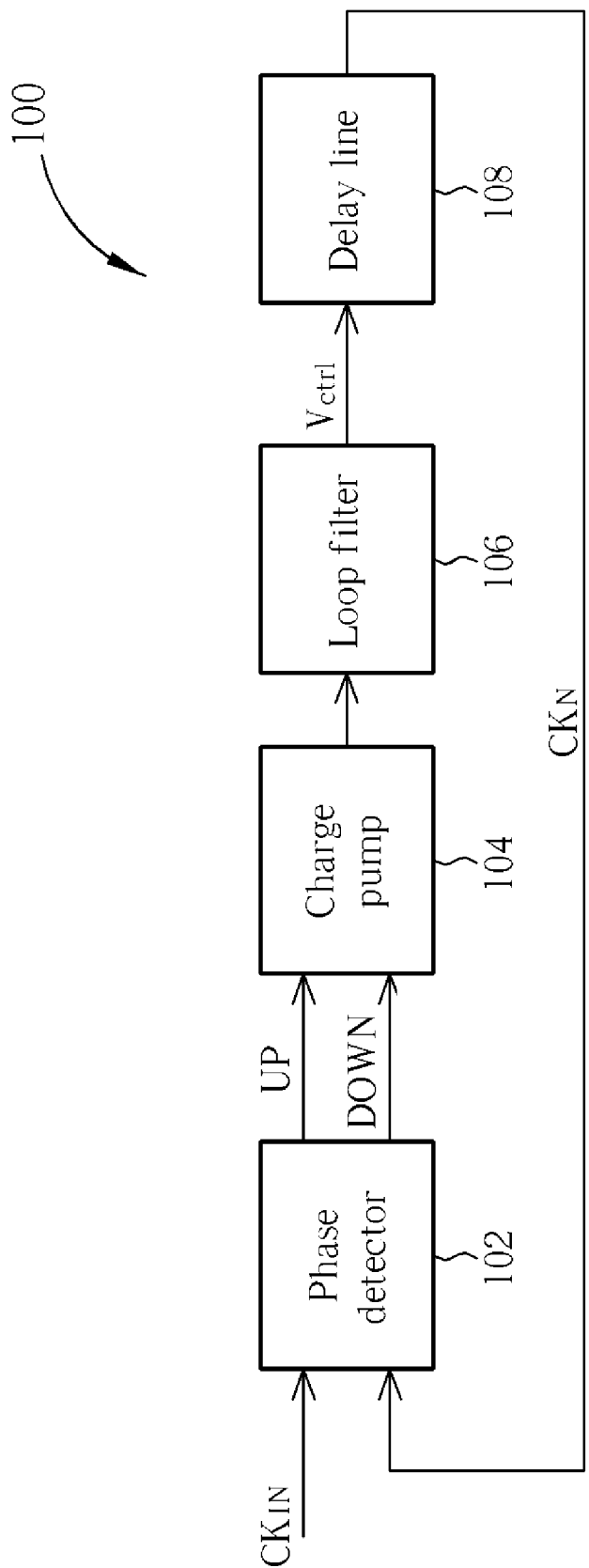
FIG. 1 is a block diagram illustrating a prior art delay circuit.
Figure 2:
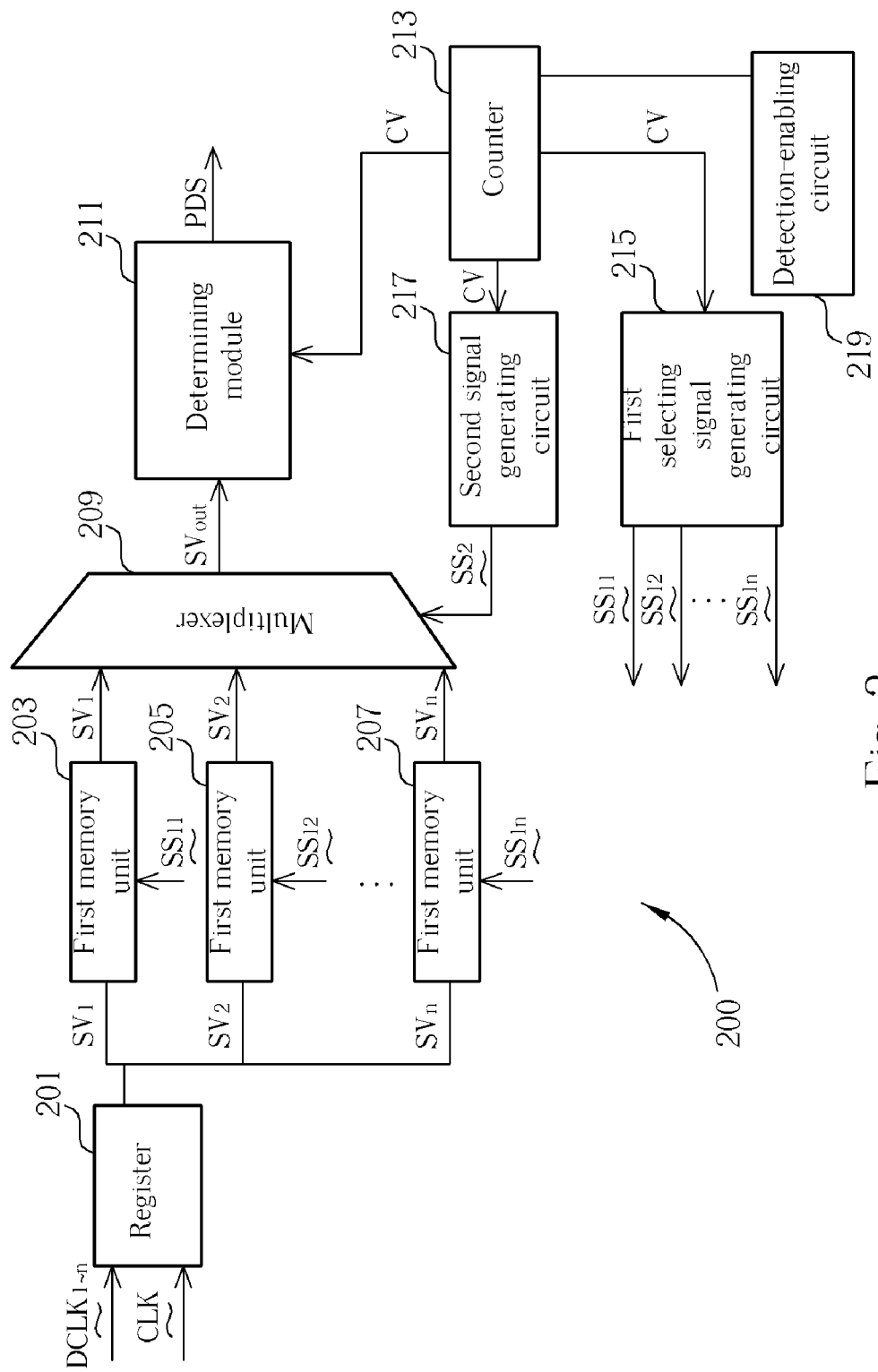
FIG. 2 is a block diagram illustrating a delaying stage selecting circuit according to a preferred embodiment of the present invention.

FIG. 2 is a block diagram illustrating a delaying stage selecting circuit 200 according to an embodiment of the present invention. As shown in FIG. 2, the delaying stage selecting circuit 200 is used for selecting a specific delaying stage from the delaying stages, i.e. it generates a specific delaying stage parameter PDS such that the follow-up circuit can select a corresponding delaying stage according to the specific delaying stage parameter PDS. These delaying stages are used for outputting a plurality of delayed clock signals. The delaying stage selecting circuit 200 includes a register 201, a plurality of first memory units 203, 205, 207, a multiplexer 209, an determining module 211, a counter 213, a first selecting signal generating circuit 215, and a second signal generating circuit 217. It should be noted that, although three first memory units are utilized in this embodiment, this is not meant to limit the scope of the present invention. The first register 201, which is coupled to the delaying stages, is used for sampling the delayed clock signals $DCLK_{1\sim N}$ according to a clock signal CLK to generate a plurality of sampled values $SV_1$, $SV_2$ ... $SV_n$. The first memory units 203, 205, and 207, which are coupled to the first register 201, are utilized to memorize the sampled values $SV_1$, $SV_2$ ... $SV_n$, and output at least one of the sampled values $SV_1$, $SV_2$ ... $SV_n$ according to corresponding first selecting signals $SS_{11}$, $SS_{12}$ ... $SS_{1n}$. The multiplexer 209, coupled to the first memory units 203, 205, 207, is used for outputting one of the sampled values $SS_{12}$ ... $SS_{1n}$ according to a second selecting signal $SS_2$.

The determining module 211, coupled to the multiplexer 209, is used for determining if two continuous sampled values of the sampled values $SV_1$, $SV_2$ ... $SV_n$ meet a specific relation. If two continuous sampled values ($SV_4$ and $SV_5$ in this example) meet a specific relation, a specific delaying stage is determined according to the second sampled value ($SV_5$ in this example) and the counting value CV from the counter 213. The counter 213, which is coupled to the determining module 211, is used for generating a counting value CV to control the delayed clock signal sampled by the register 201. When the counting value is 1, the register 201 utilizes the clock signal CLK to sample the delayed clock signal $DCLK_1$ from the first delaying stage, and when the counting value is 2, the register 201 utilizes the clock signal CLK to sample the delayed clock signal $DCLK_2$ from the second delaying stage, etc. The first selecting signal generating circuit 215, which is coupled to the counter 213, is used for generating the first selecting signals $SS_{12}$ ... $SS_{1n}$ according to the counting value CV.

The first selecting signals $SS_{12}$ ... $SS_{1n}$ are utilized for determining if the counting value CV is outputted to the multiplexer 209. The second selecting signal generating circuit 217, which is coupled to the multiplexer 209 and the counter 213, is used for setting the second selecting signal $SS_2$ according to the counting value CV. The second selecting signal $SS_2$ is used for determining if the sampled values $SV_1$, $SV_2$ ... $SV_n$ will be outputted to the determining module 211. In this embodiment, the counting values stored in the first memory units 203, 205, 207 are all 0 or 1, and the second selecting signal SS2 makes the multiplexer 209 output the value $S_{out}$, which is 1, to the determining module 211 when the first of two continuous counting values is 0 and the second is 1.

The determining module 211 outputs the specific delaying stage parameter PDS when it receives the value 1. Since selection of a new delaying stage according to the specific delaying stage parameter PDS is well known by persons skilled in the art, it is omitted for brevity. It should be noted that such a concept is not limited to the first of two continuous counting values being 0 and the second being 1, and it is also possible that the first of two continuous counting values is 1 and the second is 0. The determination rule can be determined by different sampling methods or circuits, and this also falls within the scope of the present invention. In this embodiment the clock signal can be co-utilized with other circuits, and the selected predetermined delaying stage causes the phase difference between the delayed clock signal DCLK and the clock signal CLK to equal ½ period of the clock signal CLK, but this is not a limitation of the present invention.

As described above, when the counting value CV is 1, the register 201 samples $DCLK_1$ and the first memory unit 203 unit stores the sampled value $SV_1$. When the counting value CV is 2, the register 201 samples $DCLK_2$ and the first memory unit 205 unit stores the sampled value $SV_2$, ... when the counting value CV is n, the register 201 samples $DCLK_n$ and the first memory unit 207 unit stores the sampled value $SV_n$. The values stored in the first memory units 203, 205 and 207 are outputted according to the counting value CV. For example, when the counting value is 1, $SS_{11}$ causes the value stored in the first memory unit 203 to be output, when the counting value is 2, $SS_{12}$ causes the value stored in the first memory unit 205 to be output, and when the counting value is n, $SS_{1n}$ causes the value stored in the first memory unit 207 to be output. When the counting value is 1, $SS_2$ causes the multiplexer to output the sampled value $SV_1$ as the output value $SV_{out}$, when the counting value is 2, $SS_2$ causes the multiplexer to output the sampled value $SV_2$ as the output value $SV_{out}$, ... when the counting value is n, $SS_2$ causes the multiplexer to output the sampled value $SV_n$ as the output value $SV_{out}$.

Therefore, when the sampled values S11~Sin meet a situation where the sampled value changes from 0 to 1 for the first time (a first 1 occurs), the determining module 211 receives the output value $SV_{out}$, which is 1, and outputs the counting value at that time as the specific delaying stage parameter PDS. For example, if the sampled values $SV_1$, $SV_2$, and $SV_3$ are meant to be 0, and the sampled value $SV_4$ is the first 1, the determining logic 211 outputs the counting value (4 in this example) at that time as the specific delaying stage parameter PDS. Also, the follow-up circuit selects the new delaying stage according to the specific delaying stage parameter PDS. In this embodiment, the specific delaying stage parameter PDS is directly utilized as the order of the new delaying stage (for example, if the specific delaying stage parameter PDS is 4, then the fourth delaying stage is utilized for the new delaying stage), but this is not a limitation of the present invention.

It should be noted that the relation between the first selecting signal $SS_{11}$, $SS_{12}$ ... $SS_{1n}$, the second selecting signal $SS_2$, and $DCLK_{1\sim n}$ is not limited to the above-mentioned relation, and can also be described as follows. When the counting value is 1~2, the circuit does not operate. When the counting value is 3, the register 201 samples $DCLK_1$ and the first memory unit 203 memorizes the sampled value $SV_1$, when the counting value is 4, the register 201 samples $DCLK_2$ and the first memory unit 205 memorizes the sampled value $SV_2$ ..., when the counting value is n+2, the register 201 samples $DCLK_n$ and the first memory unit 205 memorizes the sampled value $SV_n$. When the counting value is 3, $SS_2$ makes the multiplexer output the sampled value $SV_1$ as the output value $SV_{out}$, when the counting value is 4, $SS_2$ makes the multiplexer output the sampled value $SV_2$ as the output value $SV_{out}$, ... when the counting value is n+2, $SS_2$ makes the multiplexer output the sampled value $SV_n$ as the output value $SV_{out}$.

Therefore, when the sampled values $S_{11}$~$S_{in}$ meet a situation where the sampled value changes from 0 to 1 for the first time (a first 1 occurs), the determining module 211 receives the output value $SV_{out}$, which is 1, and outputs the counting value at that time as the specific delaying stage parameter PDS. Accordingly, the relation of the counting values, the first selecting signal $SS_{11}$, $SS_{12}$ ... $SS_{1n}$, the second selecting signal $SS_2$, and $DCLK_{1\sim n}$ can be adjusted according to requirements, which also falls within the scope of the present invention.

When a counting value SV is generated, the selecting signal lets the value be output to the multiplexer 209 (for example, $SS_{11}$ lets $SV_1$ be output to the multiplexer 209 when $SV_1$ is generated). Such an operation is only an example, however, and is not meant to limit the scope of the present invention. For example, counting values SV can be respectively stored to the first memory unit after all of them are computed, and first selecting signals can be utilized to output them respectively. Additionally, selecting units with the same function can replace the above-mentioned multiplexers.

The delaying stage selecting circuit 200 can further comprise a detection-enabling circuit 219, which is used for enabling the counter 213 to count the counting value CV, and stop the counter 213 counting the counting value CV after the determining module 211 determines the specific delaying stage.

Figure 3:
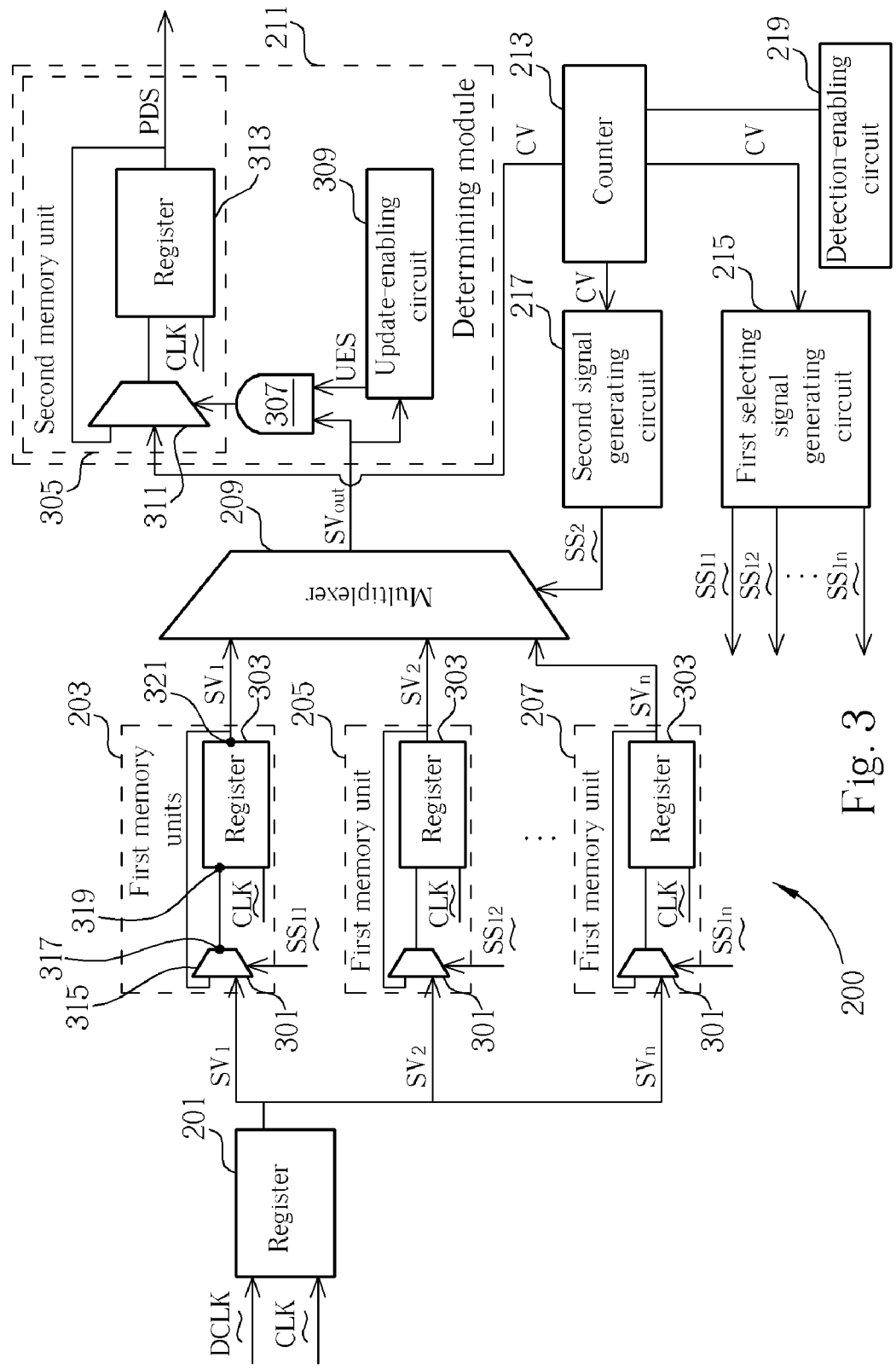
FIG. 3 is a block diagram illustrating a detailed structure of the delaying stage selecting circuit shown in FIG. 2.

FIG. 3 is a block diagram illustrating a detailed structure of the delaying stage selecting circuit 200 shown in FIG. 2. It should be noted that FIG. 3 is only one example of the present invention, and persons skilled in the art can easily change the structure and obtain the same results. As shown in FIG. 3, each of the first memory units 203, 205 and 207 includes a multiplexer 301 and a second register 303. One input terminal of the multiplexer 301 is coupled to the register 201 to respectively receive sampled values $SV_1\sim SV_N$, and another terminal is used for receiving first selecting signals $SS_{11}\sim SS_{1n}$. A clock terminal of the register 303 is coupled to the clock signal CLK, another output terminal 321 of which is coupled to an input terminal 315 of the multiplexer 301, and another input terminal 319 of which is coupled to an output terminal 317 of the multiplexer 301, wherein the multiplexer 301 selectively couples the output terminal of the register 201 to the input terminal of the register 303 or outputs the sampled values $SV_1\sim SV_N$ to the data terminal of the register 303.

In this embodiment, the output of the register 303 will maintain a previous output if the first selecting signals $SS_{11}$, $SS_{12} \ldots SS_{1n}$ do not let the sampled values of the register 201 be output to the data terminal of the register 303. The register 303 will not output sampled values SV1~SVn until the data terminal of the register 303 is switched to the sampled value of the register 201.

The above-mentioned determining module 211 can comprise a second memory unit 305, an AND gate 307 and an update-enabling circuit 309. The second memory unit 305 includes a multiplexer 311 and a register 313. The update-enabling circuit 309 is used for generating an update-enabling signal UES when two continuous sampled values meet a specific relation. The logic unit 307, which is coupled to the multiplexer 209 and the update-enabling circuit 309, is used for generating an output value according to an output of the multiplexer 209 and an output of the update-enabling circuit 309. The second memory unit 305, which is coupled to the AND gate 307 and the counter 213, is used for determining whether the original specific delaying stage parameter PDS should be utilized or the counter CV should be outputted as a new specific delaying stage parameter PDS according to the output value of the AND gate 307. The second memory unit 305 is updated by the counting value corresponding to the second sampled value when the update-enabling circuit 309 generates the update-enabling signal UES according to sampled values $SV_1\sim SV_n$.

Figure 4:
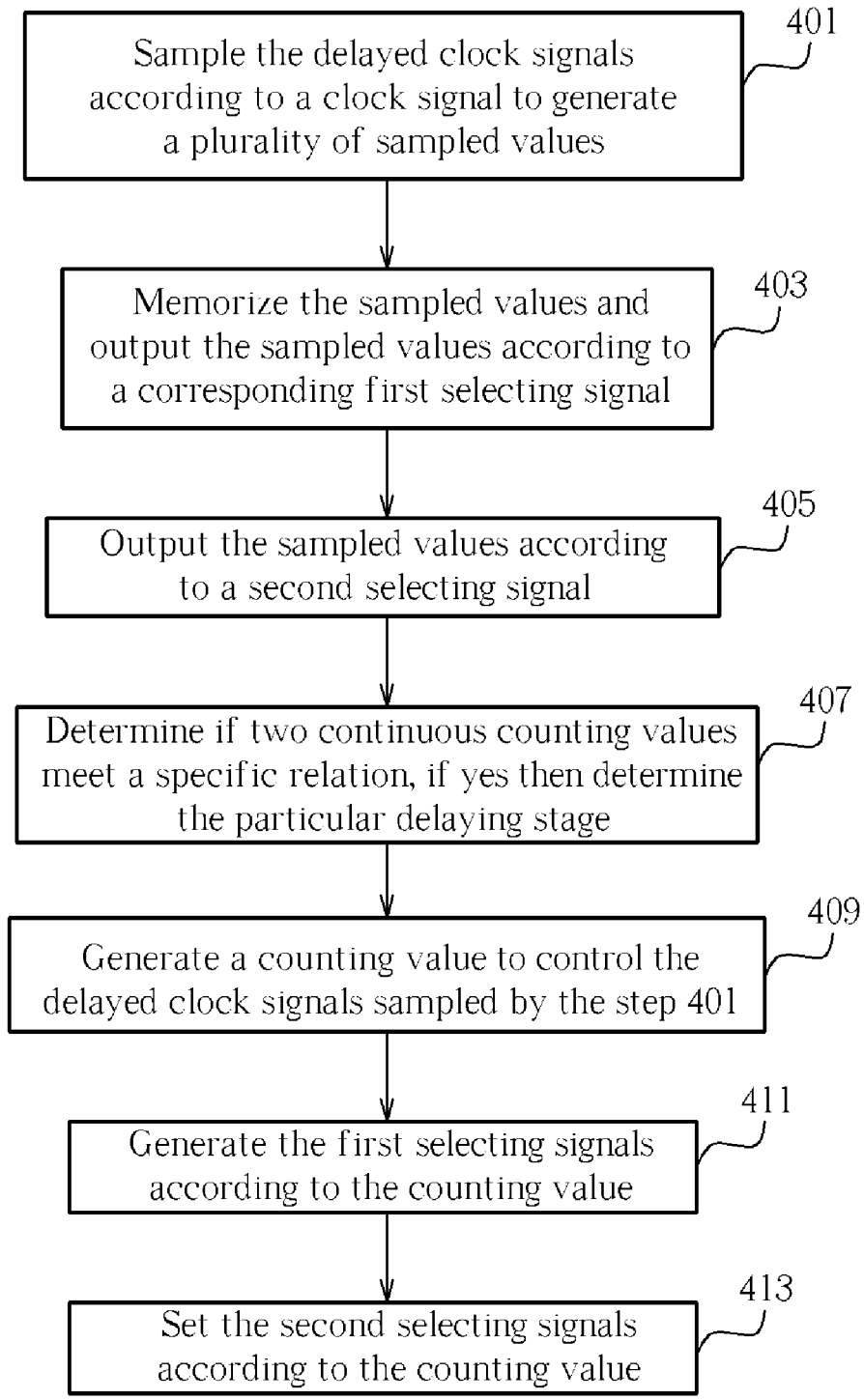
FIG. 4 is a flow chart illustrating a delaying stage selecting method corresponding to the delaying stage selecting circuit shown in FIG. 2.

FIG. 4 is a flow chart illustrating a delaying stage selecting method corresponding to the delaying stage selecting circuit 200 shown in FIG. 2. As shown in FIG. 4, the delaying stage selecting method includes:

Step 401: Sample the delayed clock signals according to a clock signal to generate a plurality of sampled values.

Step 403: Memorize the sampled values and output the sampled values according to a corresponding first selecting signal Step 405: Output the sampled values according to a second selecting signal.

Step 407: Determine if two continuous counting values meet a specific relation, if yes then determine the particular delaying stage.

Step 409: Generate a counting value to control the delayed clock signals sampled by the step 401.

Step 411: Generate the first selecting signals according to the counting value.

Step 413: Set the second selecting signals according to the counting value.

Other detailed steps and characteristics are already disclosed in the corresponding descriptions of FIG. 2 and FIG. 3, and thus are omitted for brevity here.

According to the above-mentioned system, the delay amount can be changed in real-time corresponding to different stages, thus the problems due to a wrong delay amount can be avoided.

Those skilled in the art will readily observe that numerous modifications and alterations of the device and method may be made while retaining the teachings of the invention.

What is claimed is:

1. A delaying stage selecting circuit, for selecting a specific delaying stage from a plurality of delaying stages, the delaying stages used for outputting a plurality of delayed clock signals, the delaying stage selecting circuit comprising:
    a first register, coupled to the delaying stages, for sampling the delayed clock signals according to a clock signal to generate a plurality of sampled values;
    a plurality of first memory units, coupled to the first register, wherein the first memory units are utilized to memorize the sampled values, and each of the first memory unit outputs at least one of the sampled values according to a corresponding first selecting signal;
    a first selecting unit, coupled to the first memory units, for outputting the sampled values according to a second selecting signal;
    a determining module, coupled to the first selecting unit, for determining whether sampled values meet a specific relation to generate a determination result, and determining the particular delaying stage if the determination result is positive; and
    a counter, coupled to the determining module, for generating a counting value to control the delayed clock signal sampled by the first register.

2. The delaying stage selecting circuit of claim 1, further comprising:
    a first selecting signal generating circuit, coupled to the counter, for generating the first selecting signals according to the counting value; and
    a second selecting signal generating circuit, coupled to the first selecting unit and the counter, for setting the second selecting signal according to the counting value.

3. The delaying stage selecting circuit of claim 1, wherein the determining module determines the specific delaying stage according to the counting value.

4. The delaying stage selecting circuit of claim 1, wherein the determining module comprises:

an update-enabling circuit, for generating an update-enabling signal when the sampled values meet the specific relation;

a logic unit, for generating an output value according to an output of the first selecting unit and an output of the update-enabling circuit;

a second memory unit, for determining whether the counter is to be stored according to the output value of the logic unit.

5. The delaying stage selecting circuit of claim 4, wherein the second memory unit is updated according to the counting value corresponding to at least one of the sampled values when the update-enabling circuit generates the update-enabling signal according to the sampled values.

6. The delaying stage selecting circuit of claim 4, wherein the second memory unit comprises:

a second selecting unit, for receiving the counting value and a third selecting signal; and a second register, having an input terminal coupled to the clock signal and the output terminal of the second selecting unit, and having an output terminal coupled to one of the input terminals of the second selecting unit;

wherein the second selecting unit selects one of a second register output and the counter value to output to the second register.

7. The delaying stage selecting circuit of claim 1, further comprising:

a detection-enabling circuit, coupled to the counter, for enabling the counter, and stop the counter after the determining module determines the specific delaying stage.

8. The delaying stage selecting circuit of claim 1, wherein the each first memory unit comprises:

a third selecting unit, for receiving one of the sampled values and the corresponding first selecting signal; and a third register, coupled to the clock signal and the first selecting unit, wherein the third selecting unit selectively couples the first register to the third register according to the first selecting signal.

9. The delaying stage selecting circuit of claim 1, wherein the first register samples the delayed clock signals sequentially according to the clock signal, and the second selecting unit outputs the sampled values sequentially according to the second selecting signal.

10. The delaying stage selecting circuit of claim 9, wherein the sampled values comprise a first sampled value and a second sampled values, and the specific relation comprises that the first sampled value is a first logic value and the second sampled value is a second logic value that first appears.

11. A delaying stage selecting method, for selecting a specific delaying stage from a plurality of delaying stages, the delaying stages are used for outputting a plurality of delayed clock signals, the delaying stage selecting method comprising:

sampling the delayed clock signals according to a clock signal to generate a plurality of sampled values;

memorizing the sampled values and outputting the sampled values according to a corresponding first selecting signal;

outputting the sampled values according to a second selecting signal;

determining whether the sampled values meet a specific relation to generate a determination result, and determining the particular delaying stage if the determination result is positive; and generating a counting value to control the sampled delayed clock signals.

12. The delaying stage selecting method of claim 11, further comprising:

generating the first selecting signals according to the counting value; and setting the second selecting signals according to the counting value;

wherein the specific delaying stage is determined according to the counting value.

13. The delaying stage selecting method of claim 11, further comprising:

generating an update-enabling signal when the sampled value meet a specific relation.

14. The delaying stage selecting method of claim 13, wherein the step of outputting the sampled values according to the selecting signal comprises:

generating an output value according to the outputted sampled values and the update-enabling signal, wherein the output value is updated according to the counting value corresponding to at least one of the sampled value.

15. The delaying stage selecting method of claim 14, further comprising:

determining if the counter value is stored or not according to the output value.

16. The delaying stage selecting method of claim 11, further comprising:

generating an enable signal to start generating the counting value; and stopping generating the counting value after the specific delaying stage is determined.

17. The delaying stage selecting method of claim 11, wherein the sampled values comprise a first sampled value and a second sampled values, and the specific relation comprises that the first sampled value is a first logic value and the second sampled value is a second logic value that first appears.

* * * * *